United States Patent
Lee et al.

(10) Patent No.: US 10,164,089 B1
(45) Date of Patent: Dec. 25, 2018

(54) POWER MOSFET

(71) Applicant: United Microelectronics Corp., Hsinchu (TW)

(72) Inventors: Shao-Cian Lee, Hsinchu County (TW); Hong-Ze Lin, Hsinchu (TW); Lung-Chih Wang, Hsinchu County (TW); Shan-Yuan Wang, Nantou County (TW)

(73) Assignee: United Microelectronics Corp., Hsinchu (TW)

( * ) Notice: Subject to any disclaimer, the term of this patent is extended or adjusted under 35 U.S.C. 154(b) by 5 days.

(21) Appl. No.: 15/806,963

(22) Filed: Nov. 8, 2017

(30) Foreign Application Priority Data

Oct. 13, 2017 (CN) .......................... 2017 1 0952623

(51) Int. Cl.
*H01L 29/00* (2006.01)
*H01L 29/78* (2006.01)
*H01L 29/06* (2006.01)
*H01L 29/10* (2006.01)

(52) U.S. Cl.
CPC ...... *H01L 29/7813* (2013.01); *H01L 29/0653* (2013.01); *H01L 29/0696* (2013.01); *H01L 29/1095* (2013.01)

(58) Field of Classification Search
None
See application file for complete search history.

(56) References Cited

U.S. PATENT DOCUMENTS

| 2003/0201483 A1* | 10/2003 | Sumida | H01L 29/0634 257/302 |
| 2013/0187196 A1* | 7/2013 | Kadow | H01L 27/088 257/140 |
| 2014/0042525 A1* | 2/2014 | Darwish | H01L 29/7395 257/329 |

FOREIGN PATENT DOCUMENTS

EP 0978871 2/2000

* cited by examiner

*Primary Examiner* — Reema Patel
(74) *Attorney, Agent, or Firm* — J.C. Patents

(57) ABSTRACT

A power MOSFET including a first transistor and a second transistor is provided. The first and the second transistors respectively include following elements. A well region is located in a substrate structure. A trench gate is disposed in the well region. First doped regions are disposed in the well region at two sides of the trench gate. A first metal layer is disposed on a first surface of the substrate structure and electrically connected to the first doped regions. A second doped region is disposed in the substrate structure. A second metal layer is disposed on a second surface of the substrate structure opposite to the first surface and electrically connected to the second doped region. The well regions of the first and the second transistors are separated from each other. The first and the second transistors share the second doped region and the second metal layer.

20 Claims, 2 Drawing Sheets

POWER MOSFET

CROSS-REFERENCE TO RELATED APPLICATION

This application claims the priority benefit of China application serial no. 201710952623.2, filed on Oct. 13, 2017. The entirety of the above-mentioned patent application is hereby incorporated by reference herein and made a part of this specification.

BACKGROUND OF THE INVENTION

1. Field of the Invention

The invention relates to a transistor, and particularly relates to a power metal oxide semiconductor field effect transistor (power MOSFET).

2. Description of Related Art

When electrically testing a power MOSFET, the electrical test is performed by applying voltage on both of the front electrode and the back electrode of the power MOSFET.

In the trend of reducing the power loss, increasing the power saving effect and reducing the resistance by thinning the wafer, the thinned wafer tends to bend, so an adhesive tape will stick on the back of the thinned wafer to suppress a deformation of the wafer.

Accordingly, the thinned wafer cannot be tested in the wafer stage by the conventional test method for the power MOSFET, but must be tested in the package stage. In this way, the cycle time and test cost for testing the power MOSFET will be increased.

SUMMARY OF THE INVENTION

The invention provides a power MOSFET where an electrical test can be performed by using only the metal layers on the same surface.

The invention provides a power MOSFET including a first transistor and a second transistor. The first transistor and the second transistor respectively include a substrate structure, a well region, at least one trench gate, a plurality of first doped regions, a first metal layer, a second doped region and a second metal layer. The substrate structure has a first conductive type. The well region has a second conductive type and is located in the substrate structure. The trench gate is disposed in the well region. The first doped regions have the first conductive type and are disposed in the well region at two sides of the trench gate. The first metal layer is disposed on a first surface of the substrate structure and electrically connected to the first doped regions. The second doped region has the first conductive type and is disposed in the substrate structure below the well region. The second metal layer is disposed on a second surface of the substrate structure opposite to the first surface and electrically connected to the second doped region. The well region of the first transistor and the well region of the second transistor are separated from each other. The first transistor and the second transistor share the second doped region and the second metal layer.

According to one embodiment of the invention, in the power MOSFET, the trench gate may be electrically insulated from the well region, the first doped regions and the first metal layer.

According to one embodiment of the invention, the power MOSFET may further include an isolation structure. The isolation structure is disposed between the first transistor and the second transistor. The isolation structure isolates the neighboring first doped regions between the first transistor and the second transistor and isolates the first metal layer of the first transistor from the first metal layer of the second transistor.

According to one embodiment of the invention, in the power MOSFET, the isolation structure may include at least one of a field oxide layer and a first dielectric layer.

According to one embodiment of the invention, in the power MOSFET, an electric current path between the first transistor and the second transistor may include a forward bias between the well region and the substrate structure when performing an electrical test.

According to one embodiment of the invention, in the power MOSFET, an electric current path between the first transistor and the second transistor may include a forward bias and a reverse bias between the well region and the substrate structure when performing an electrical test.

According to one embodiment of the invention, in the power MOSFET, a distance between the well region of the first transistor and the well region of the second transistor may be larger than a total thickness of the substrate structure and the second metal layer.

According to one embodiment of the invention, in the power MOSFET, the first transistor and the second transistor may be connected in parallel.

According to one embodiment of the invention, in the power MOSFET, the first transistor and the second transistor may be symmetrical or asymmetrical with respect to each other.

According to one embodiment of the invention, in the power MOSFET, the substrate structure may include a silicon substrate and an epitaxial layer disposed on the silicon substrate.

According to one embodiment of the invention, in the power MOSFET, the well region may be located in the epitaxial layer.

According to one embodiment of the invention, in the power MOSFET, the second doped region may be located in the silicon substrate.

According to one embodiment of the invention, in the power MOSFET, the second doped region and the well region may be separated from each other.

According to one embodiment of the invention, the above-mentioned power MOSFET further includes a protection layer. The protection layer is disposed on the first metal layer.

According to one embodiment of the invention, in the power MOSFET, the protection layer may expose a portion of the first metal layer of the first transistor and a portion of the first metal layer of the second transistor.

According to one embodiment of the invention, the above-mentioned power MOSFET may further include a first gate pad and a second gate pad. The first gate pad is electrically connected to the trench gate of the first transistor. The second gate pad is electrically connected to the trench gate of the second transistor.

According to one embodiment of the invention, in the power MOSFET, the protection layer may expose a portion of the first gate pad and a portion of the second gate pad.

According to one embodiment of the invention, in the power MOSFET, the first transistor and the second transistor may respectively further include a second dielectric layer.

The second dielectric layer is disposed between the trench gate and the substrate structure.

According to one embodiment of the invention, in the power MOSFET, the first transistor and the second transistor may respectively further include a third dielectric layer. The third dielectric layer is disposed between the trench gate and the first metal layer.

According to one embodiment of the invention, the above-mentioned power MOSFET may further include a third doped region. The third doped region has the second conductive type and is located in the well region.

As described above, since the well region of the first transistor and the well region of the second transistor are separated from each other in the power MOSFET of the invention, the electrical test may be done by only using the first metal layers on the same first surface when performing the electrical test on the power MOSFET. In this way, even if the wafer is thinned, the electrical test on thinned wafers can also be completed in the wafer stage. Accordingly, the fault or problem wafer may be found out in advance in the wafer stage without the need to perform a test after the wafer is packaged, and thus the cycle time and test cost for testing the power MOSFET can be reduced.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
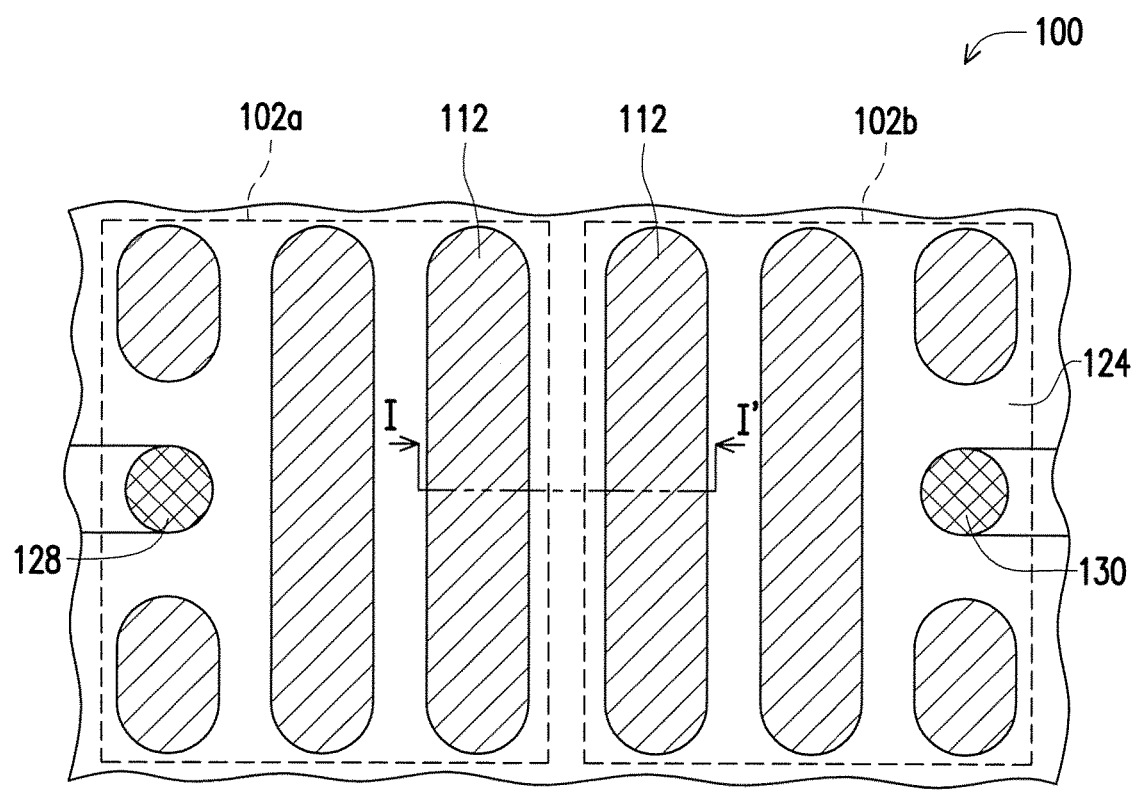
FIG. 1 is a top view of a power MOSFET according to one embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
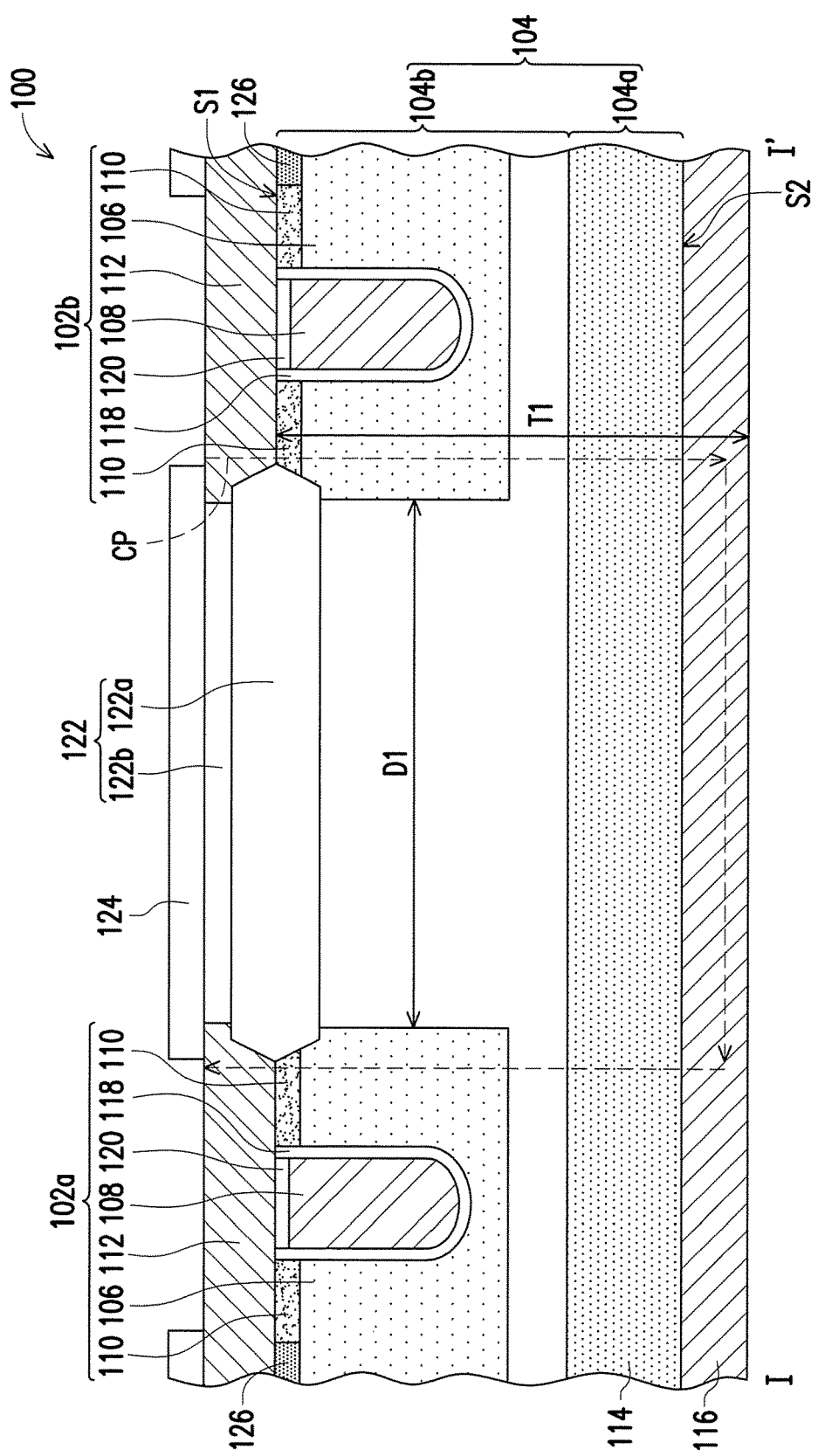
FIG. 2 is a cross-sectional view along line I-I' in FIG. 1.

FIG. 1 is a top view of a power MOSFET according to one embodiment of the invention. FIG. 2 is a cross-sectional view along line I-I' in FIG. 1.

Referring to FIGS. 1 and 2, the power MOSFET 100 includes a transistor 102a and a transistor 102b. The transistor 102a and the transistor 102b may be connected in parallel and used as a single transistor on the equivalent circuit. The transistor 102a and the transistor 102b may be symmetrical or asymmetrical with respect to each other. In the present embodiment, the transistor 102a and the transistor 102b are illustrated as being structurally symmetrical with respect to each other, but the invention is not limited thereto.

The transistor 102a and the transistor 102b include a substrate structure 104, a well region 106, at least one trench gate 108, a plurality of doped regions 110, a metal layer 112, a doped region 114, and a metal layer 116, respectively, and may further include a dielectric layer 118 and a dielectric layer 120.

In the following, the first conductive type and the second conductive type represent different conductive types. Specifically, the first conductive type may be one of N-type and P-type, and the second conductive type may be the other of N-type and P-type. In the present embodiment, the first conductive type is illustrated by taking N-type as an example, and the second conductive type is illustrated by taking P-type as an example, but the invention is not limited thereto.

The substrate structure 104 has the first conductive type. In the present embodiment, the conductive type of the substrate structure 104 is illustrated by taking N-type as an example. For example, the substrate structure 104 may include a silicon substrate 104a and an epitaxial layer 104b disposed on the silicon substrate 104a. The silicon substrate 104a and the epitaxial layer 104b may have the first conductive type, respectively. In the present embodiment, the silicon substrate 104a and the epitaxial layer 104b are illustrated by taking a N-type lightly-doped silicon substrate and a N-type lightly-doped epitaxial layer as an example, respectively, but the invention is not limited thereto. The material of the epitaxial layer 104b is, for example, epitaxial silicon. The epitaxial layer 104b may be formed by, for example, an epitaxial growth process.

The well region 106 has the second conductive type and is located in the substrate structure 104. The well region 106 may be located in the epitaxial layer 104b. The well region 106 of the transistor 102a and the well region 106 of the transistor 102b are separated from each other. The distance D1 between the well region 106 of the transistor 102a and the well region 106 of the transistor 102b may be larger than the total thickness T1 of the substrate structure 104 and the metal layer 116. In the present embodiment, the well region 106 is illustrated by taking a P-type well region as an example. The well region 106 may be forming by, for example, an ion implantation process.

The trench gate 108 is disposed in the well region 106. The trench gate 108 may be electrically insulated from the well region 106, doped regions 110 and the metal layer 112. The material of the trench gate 108 is, for example, a conductive material such as doped polysilicon. The trench gate 108 may be formed by, for example, forming an opening (not shown) in the substrate structure 104, followed by forming a conductive material layer filling up the opening, and removing the conductive material layer outside the opening. The conductive material layer may be formed by, for example, a furnace method. In the present embodiment, the transistor 102a and the transistor 102b are illustrated as including one trench gate 108, respectively, but the invention is not limited thereto. In other embodiments, the transistor 102a and the transistor 102b may further include a plurality of trench gates 108, respectively, and the plurality of trench gates 108 of the transistor 102a may be connected in series with each other and the plurality of trench gates 108 of the transistor 102b may be connected in series with each other.

The doped regions 110 have the first conductive type and is disposed in the well region 106 at two sides of the trench gate 108. The doped regions 110 may be used as a source. The doped regions 110 of the transistor 102a and the doped regions 110 of the transistor 102b may be separated from each other. In the present embodiment, the doped regions 110 are illustrated by taking a N-type heavily-doped region as an example. The doped regions 110 may be formed by, for example, an ion implantation process.

The metal layer 112 is disposed on the surface S1 of the substrate structure 104 and electrically connected to the doped regions 110. The metal layer 112 of the transistor 102a and the metal layer 112 of the transistor 102b may be separated from each other. The material of the metal layer 112 is, for example, a metal such as Ti, TiN or AlCu. The metal layer 112 may be formed by, for example, a physical vapor deposition method.

The doped region 114 has the first conductive type and is disposed in the substrate structure 104 below the well region 106. For example, the doped region 114 may be located in the silicon substrate 104a. The doped region 114 may be used as a drain. The transistor 102a and the transistor 102b share the doped region 114. The doped region 114 and the well region 106 may be separated from each other. In the present embodiment, the doped region 114 is illustrated by taking a N-type heavily-doped region as an example. The doped region 114 may be formed by, for example, an ion implantation process.

The metal layer 116 is disposed on the surface S2 of the substrate structure 104 opposite to the surface S1 and electrically connected to the doped region 114. The transistor 102a and the transistor 102b share the metal layer116. The material of the metal layer 116 is, for example, a metal such as Ti, Ni or Cu. The metal layer 116 may be formed by, for example, a physical vapor deposition method.

The dielectric layer 118 is disposed between the trench gate 108 and the substrate structure 104 and can be used as a gate dielectric layer. The material of the dielectric layer 118 is, for example, silicon oxide. The dielectric layer 118 may be formed by, for example, a thermal oxidation process.

The dielectric layer 120 is disposed between the trench gate 108 and the metal layer 112. The material of the dielectric layer 120 is, for example, silicon oxide. The dielectric layer 120 may be formed by, for example, a chemical vapor deposition method.

In addition, the power MOSFET 100 may further include at least one of an isolation structure 122, a protection layer 124, a doped region 126, a gate pad 128, and a gate pad 130.

The isolation structure 122 is disposed between the transistor 102a and the transistor 102b. The isolation structure 122 isolates the neighboring doped regions 110 between the transistor 102a and the transistor 102b and isolates the metal layer 112 of the transistor 102a from the metal layer 112 of the transistor 102b. The isolation structure 122 may include at least one of a field oxide layer 122a and a dielectric layer 122b. The field oxide layer 122a may be disposed in the substrate structure 104. The dielectric layer 122b may be disposed on the field oxide layer 122a. The materials of the field oxide layer 122a and the dielectric layer 122b are, for example, silicon oxide. The field oxide layer 122a may be formed by, for example, a thermal oxidation process. The dielectric layer 122b may be formed by, for example, a chemical vapor deposition method.

The protection layer 124 is disposed on the metal layer 112. The protection layer 124 may expose a portion of the metal layer 112 of the transistor 102a and a portion of the metal layer 112 of the transistor 102b, wherein the metal layers 112 exposed from the protection layer 124 may be respectively used as a source pad of the transistor 102a and a source pad of the transistor 102b.

The doped region 126 has the second conductive type and is located in the well region 106. In the present embodiment, the doped region 126 is illustrated by taking a P-type heavily-doped region as an example. The doped region 126 may be formed by, for example, an ion implantation process.

The gate pad 128 is electrically connected to the trench gate 108 of the transistor 102a. The gate pad 130 is electrically connected to the trench gate 108 of the transistor 102b. For example, the gate pad 128 and the gate pad 130 may be electrically connected to the trench gate 108 of the transistor 102a and the trench gate 108 of the transistor 102b, respectively, via an interconnect structure (not shown). In addition, the protection layer 124 may expose a portion of the gate pad 128 and a portion of the gate pad 130.

In addition, the electric current path between the transistor 102a and the transistor 102b may include a forward bias and a reverse bias between the well region 106 and the substrate structure 104 when performing an electrical test on the power MOSFET 100. The electrical parameters tested by the electrical test are, for example, the on-resistance (Ron), the threshold voltage (Vt), the leak current between device drain and source side (IDSS), the junction breakdown voltage between device drain and source side (BVDSS), the leak current between device gate and source side (IGSS) or the breakdown voltage between device gate and source side (BVGSS).

For example, when testing the on-resistance (Ron) of the transistor 102a, a high voltage may be applied to the metal layer 112 of the transistor 102b, a high voltage may be applied to the trench gate 108 of the transistor 102a, and the metal layer 112 of the transistor 102a may be grounded to measure the on-resistance (Ron) of the tested transistors 102a. At this time, the electric current path CP between the transistor 102a and the transistor 102b may include a forward bias between the well region 106 of the transistor 102b and the substrate structure 104 as shown in FIG. 1.

For example, when testing the junction breakdown voltage between device drain and source side (BVDSS) of the transistor 102a, a high voltage may be applied to the metal layer 112 of the transistor 102b, the trench gate 108 of the transistor 102a may be grounded, and the metal layer 112 of the transistor 102a may be grounded to measure the junction breakdown voltage between device drain and source side (BVDSS) of the tested transistors 102a. At this time, the electric current path CP between the transistor 102a and the transistor 102b may include a forward bias between the well region 106 of the transistor 102b and the substrate structure 104 and a reverse bias between the well region 106 of the transistor 102a and the substrate structure 104 as shown in FIG. 1.

In view of the above-mentioned embodiment, since the well region 106 of the transistor 102a and the well region 106 of the transistor 102b are separated from each other in the power MOSFET 100, the electrical test may be done by using only the metal layers 112 on the same surface S1 when performing the electrical test on the power MOSFET 100. In this way, even if the wafer is thinned, the electrical test on thinned wafers can also be completed in the wafer stage. Accordingly, the fault or problem wafer may be found out in advance in the wafer stage without the need to perform the test after the wafer is packaged, and thus the cycle time and test cost for testing the power MOSFET 100 can be reduced.

In view of the above, in the power MOSFET of the above-mentioned embodiment, the electrical test may be completed by only using the metal layers on the same surface, the electrical test can be completed in the wafer stage, and therefore the cycle time and test cost for testing the power MOSFET can be reduced.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A power MOSFET comprising:
a first transistor and a second transistor respectively comprising:
a substrate structure having a first conductive type;
a well region having a second conductive type and located in the substrate structure;
at least one trench gate disposed in the well region, wherein a portion of a bottom of the well region is located directly below a bottom of the at least one trench gate;
a plurality of first doped regions having the first conductive type and disposed in the well region at two sides of the at least one trench gate;
a first metal layer disposed on a first surface of the substrate structure and electrically connected to the plurality of first doped regions;
a second doped region having the first conductive type and disposed in the substrate structure below the well region; and
a second metal layer disposed on a second surface of the substrate structure opposite to the first surface and electrically connected to the second doped region, wherein
the well region of the first transistor and the well region of the second transistor are separated from each other, and
the first transistor and the second transistor share the second doped region and the second metal layer.

2. The power MOSFET of claim 1, wherein the at least one trench gate is electrically insulated from the well region, the plurality of first doped regions and the first metal layer.

3. The power MOSFET of claim 1, further comprising an isolation structure, wherein the isolation structure is disposed between the first transistor and the second transistor, and isolates the neighboring plurality of first doped regions between the first transistor and the second transistor and isolates the first metal layer of the first transistor from the first metal layer of the second transistor.

4. The power MOSFET of claim 3, wherein the isolation structure comprises a field oxide layer, a first dielectric layer or a combination thereof.

5. The power MOSFET of claim 1, wherein an electric current path between the first transistor and the second transistor comprises a forward bias between the well region and the substrate structure when performing an electrical test.

6. The power MOSFET of claim 1, wherein an electric current path between the first transistor and the second transistor comprises a forward bias and a reverse bias between the well region and the substrate structure when performing an electrical test.

7. The power MOSFET of claim 1, wherein a distance between the well region of the first transistor and the well region of the second transistor is larger than a total thickness of the substrate structure and the second metal layer.

8. The power MOSFET of claim 1, wherein the first transistor and the second transistor are connected in parallel.

9. The power MOSFET of claim 1, wherein the first transistor and the second transistor are symmetrical or asymmetrical with respect to each other.

10. The power MOSFET of claim 1, wherein the substrate structure comprises a silicon substrate and an epitaxial layer disposed on the silicon substrate.

11. The power MOSFET of claim 10, wherein the well region is located in the epitaxial layer.

12. The power MOSFET of claim 10, wherein the second doped region is located in the silicon substrate.

13. The power MOSFET of claim 1, wherein the second doped region and the well region are separated from each other.

14. The power MOSFET of claim 1, further comprising a protection layer, wherein the protection layer is disposed on the first metal layer.

15. The power MOSFET of claim 14, wherein the protection layer exposes a portion of the first metal layer of the first transistor and a portion of the first metal layer of the second transistor.

16. The power MOSFET of claim 14, further comprising:
a first gate pad electrically connected to the at least one trench gate of the first transistor; and
a second gate pad electrically connected to the at least one trench gate of the second transistor.

17. The power MOSFET of claim 16, wherein the protection layer exposes a portion of the first gate pad and a portion of the second gate pad.

18. The power MOSFET of claim 1, wherein the first transistor and the second transistor respectively further comprise a second dielectric layer, wherein the second dielectric layer is disposed between the at least one trench gate and the substrate structure.

19. The power MOSFET of claim 1, wherein the first transistor and the second transistor respectively further comprise a third dielectric layer, wherein the third dielectric layer is disposed between the at least one trench gate and the first metal layer.

20. The power MOSFET of claim 1, further comprising a third doped region, wherein the third doped region has the second conductive type and is located in the well region.

* * * * *